United States Patent [19]

Tatusko et al.

[11] 3,777,220

[45] Dec. 4, 1973

[54] CIRCUIT PANEL AND METHOD OF CONSTRUCTION

[75] Inventors: Philip A. Tatusko, Endwell; Richard A. Williams, Candor, both of N.Y.

[73] Assignee: International Business Machines Corporation, Armonk, N.Y.

[22] Filed: June 30, 1972

[21] Appl. No.: 267,825

[52] U.S. Cl. .............. 317/101 A, 174/685, 317/100, 317/101 B

[51] Int. Cl. .............. H05k 1/04

[58] Field of Search .............. 317/101 CM, 101 CP, 317/101 R, 101 A, 101 E, 100; 29/627; 174/68.5

[56] References Cited

UNITED STATES PATENTS

| | | | |
|---|---|---|---|
| 3,489,952 | 1/1970 | Hinchey | 174/68.5 |
| 3,579,056 | 5/1971 | TeVelde et al. | 317/101 F |
| 3,256,465 | 6/1966 | Weissenstern | 317/101 A |
| 3,582,865 | 6/1971 | Franck | 317/101 CM |

*Primary Examiner*—David Smith, Jr.
*Attorney*—Kenneth P. Johnson et al.

[57] ABSTRACT

A hybrid circuit panel formed of both organic and inorganic materials to provide discrete areas of panel surface having different coefficients of expansion thereby providing mounting sites for semiconductor devices which have a coefficient of expansion approximating the semiconductor device. A construction method is disclosed in which previously formed inorganic substrates are placed in openings of semi-cured organic polymeric material containing inorganic fibers. The composite is compressed under heat and pressure to cause limited flow of the organic material and subsequent curing to thereby grip the inserted inorganic substrates. The organic substrate can be formed of a single layer of curable resin or a plurality of sheets of semi-cured resin laid up to form a composite panel. Conventional printed circuit techniques of either the subtractive or additive processes are used to form conductors on the surface of the inorganic and organic materials alike to thereby allow direct attachment of the semiconductor devices. This arrangement eliminates one level of packaging frequently used in the past, and provides a stable attachment between the devices and their substrates.

14 Claims, 8 Drawing Figures

CIRCUIT PANEL AND METHOD OF CONSTRUCTION

BACKGROUND OF THE INVENTION

Heretofore semiconductor devices, such as integrated circuit chips, have been mounted via solder joints on inorganic substrates which, in turn, are mounted by means of pins inserted in organic circuit panels which are formed with printed conductors and holes. "Organic" panels are often inorganic fibers impregnated with an organic polymeric resin. This method of packaging has been necessitated because of the difference in coefficients of expansion between the inorganic semiconductor chip and organic circuit panel. Although semi-flexible solder columns are used to support the circuit chip above the surface of the panel, the temperature excursions of the assembly causes premature fatigue failure of the solder columns and hence, poor reliability of the product. The use of an intermediate layer of an inorganic material, such as alumina or ceramic, enabled the use of stronger support pins to accommodate the change in dimensions due to heating and cooling during operation. The interposed stable, ceramic layer, however, adds to the cost of the circuit package and also serves to limit the packaging density that may otherwise be possible.

The use of an inorganic substrate, such as a ceramic, as a support for integrated chips has several advantages. The coefficient of expansion of the ceramic is quite similar to that of the commonly used semiconductor materials and thus results in little stress on the joints during expansion and contraction. The inorganic materials are generally good heat conductors so that the energy from the chip operation can usually be efficiently removed. Another advantage is that the inorganic materials can withstand relatively high temperatures so that soldering can readily take place to attach the chips to the ceramic substrates. The ceramic serves as a good base for the formation of adherent printed circuits by either the additive or the subtractive processes and provides a desirable dielectric constant.

Nevertheless, it is expensive to add an intermediate layer of circuitry between the chip and organic panel because of the added steps of construction and assembly. Reliability is also reduced because of the increased number of processing steps, and signal path lengths are increased thus increasing transmission time.

Organic circuit panels, usually formed of inorganic glass cloth layers impregnated with epoxy resins have several desirable properties as circuit substrates. They can be easily machined such as having holes drilled therein, whereas the ceramics after firing become difficult and expensive to drill. An organic panel has an inherent degree of flexibility which is desirable in damping vibrations, and relatively large panels can be formed without fear of breakage which is not true of the ceramic substrates.

The desirability of eliminating the intermediate layer has been recognized. As one alternative, circuit chips have been cast in position in a layer of flexible resin. This approach has the disadvantage, however, of preventing replacement of a chip in the event that one fails. Although a chip may be removed, it cannot reliably be replaced without harm to the printed circuit conductors which are formed on both the resin and chip proper to provide the necessary interconnections. Another approach has been to form openings in the resinous substrate and adhesively implace the chip with a curable polymer. This approach also limits replacement of defective chips.

Accordingly, the primary object of this invention is to provide a substrate for supporting electrical conductors and components which has discrete portions with different coefficients of expansion. Another important object of this invention is to provide an electrically insulative substrate having discrete portions thereof which have a coefficient of expansion closely matching an electrical component thereon, while other areas of the substrate have different coefficients of expansion. A further object of the invention is to provide a generally homogeneous first substrate of both organic and inorganic materials with islands of a second inorganic substrate material embedded in the first material. A still further object of this invention is to provide a substrate for electrical conductors and components of a first material which has completely buried therein a second sbustrate material with a different coefficient of expansion and which would affect the surface of the substrate to provide a more stable support for components or conductors mounted thereover. Yet another object of this invention is to provide an insulative substrate which has temperature stable support areas for mounting components and less stable areas which can be used for mounting conductors and for machining or altering the substrate. Another object is to provide a method of constructing an electrically insulated substrate having differing coefficients of expansion by molding inserts of one expansion characteristic in an opening formed in semi-cured multiple substrates of a different expansion characteristic.

SUMMARY OF THE INVENTION

In the attainment of the foregoing objects, the invention contemplates the insertion of one substrate material at discrete locations within a second supporting substrate material. One material is chosen so that its expansion characteristic is similar to that of an electrical component to be mounted thereon, and thus minimize relative movement between the two elements. The supporting substrate material, however, is chosen to have easy manufacturing and machining characteristics. It can be used for elements such as conductors where the coefficient of expansion of the support substrate is not as critical. The resulting substrate is thus a composite of materials with differing coefficients of expansion.

The illustrative embodiment of the invention utilizes a conventional resinous type substrate having therein strengthening inorganic fibers as a support for more temperature stable inorganic or ceramic materials. Ceramic, when chosen with a coefficient of expansion similar to the mounted semiconductor material, reduces and nearly eliminates the fatigue failure of connecting joints.

Conductors can be laid over both substrate materials since they can usually withstand the difference of an expansion. The disclosed construction permits circuits to be formed on the surfaces by either known subtractive (etching) processes or the additive (plating-up) processes without expensive deviation in the usual construction steps.

In a second embodiment, the more stable substrate material is buried entirely within the less stable material, but because of the difference in characteristics the former lends a significant degree of stability at the adjacent surface of the less stable material. This embodiment has the advantage of maintaining all processing steps identical with more conventional construction when adding circuit lines to the surface of the substrate. The supporting substrate can also be of multilayer construction and thus have internal conductive planes. The more stable inorganic substrate material is usually a better heat conductor and the option is available to attach heat sinks to such discrete substrate portions for effective cooling of the active electrical devices.

The embodiments of the invention readily lend themselves to known processing steps. In the preferred embodiments, conventional glass fiber cloth impregnated with epoxy resin is brought to an intermediate cure stage as in the usual production, and then punched or drilled out in the configuration of the inorganic insert to be mounted. A sufficient number of the resin-impregnated sheets of cloth are piled with their punched holes aligned until the desired thickness is reached, and then the inorganic insert is placed in the hole and the composite structure laminated under heat and pressure. This compresses the stacked plies to the desired thickness and completely cures the polymeric resin. The result is a composite or hybrid electrical substrate. Since the usual insert is of a ceramic material, the surrounding plies are usually compressed only to the level of the thickness of the insert. An alternative method is to use cut out slip sheets between press platens to thereby relieve pressure on the more brittle inserts.

BRIEF DESCRIPTION OF THE DRAWINGS

The foregoing and other objects, features, and advantages of the invention will be apparent from the following more particular description of preferred embodiments of the invention, as illustrated in the accompanying drawings wherein.

DESCRIPTION OF THE PREFERRED EMBODIMENTS

Figure 1:
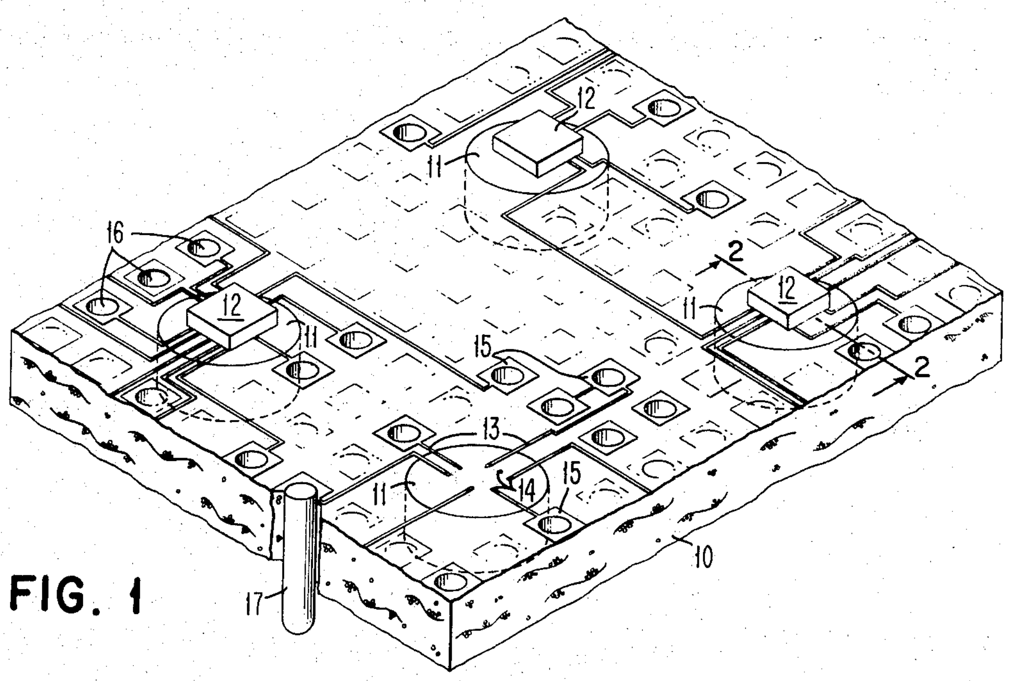
FIG. 1 is a perspective view of a hybrid substrate for printed circuits and components constructed in accordance with the principles of the invention.

Referring to FIG. 1, the hybrid electrically insulative substrate of the invention comprises a primary organic-inorganic substrate 10 containing a plurality of inorganic inserts 11 embedded within the primary substrate 10. Secondary inserts 11 are shown as being cylindrical and of a size sufficient to accommodate thereon the mounting of a single semi-conductor component or circuit chip 12. The inserts can, of course, be of various shapes and sizes. Circuit lines 13 are formed on and overlie both substrate 10 and inserts 11. Lines 13 terminate at miniature lands 14 on the inserts, and usually at lands 15 containing holes 16, although the lines 13 may connect directly with other semiconductor chips on other inserts. Holes 16 permit the mounting of pins 17 when and where desirable to enable interconnection with other discrete conductors as by soldering or wire wrapping. Conductive lines 13 thus permit the interconnection among circuit chips for access to conductors on or within the same or other substrates.

Figure 2:
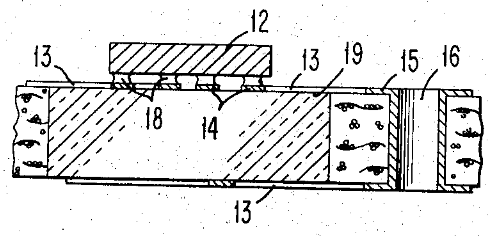
FIG. 2 is a cross-sectional view taken along the lines 2—2 of FIG. 1.

In the cross-section of FIG. 2, inorganic insert 11 is the same thickness as primary substrate 10 so that their respective major surfaces are co-planar. Conductive circuit lines 13 can also be applied to the bottom surface of both the insert and primary substrate if desired, and, of course, the circuit lines can connect with the lands about hole 16. Chip 12 is supported on a plurality of solder columns 18 which support the bottom surface of the chip above the circuit lines and provide the dual purpose of electrical interconnections and mechanical support between the chip and selected circuit lines 13.

The use of solder columns 18 is to provide a more flexible support, thus allowing the columns to bend if relative movement occurs between chip and substrate. The columns are formed by placing the chip with preformed solder mounds on the underside thereof in contact with aligned tin-lead mounds on lands 14 on the substrate, and applying sufficient local heat to reflow the solder, producing the connection. It is these joints 18 that experience fatigue when semiconductor chips 12 are directly attached to the usual substrate material 10, such as the phenolic or epoxy-impregnated glass cloth. The difference in expansion and contraction between the chip 12 and primary substrate 10 produce stresses on the solder joints 18. After several heating and cooling cycles, some of the solder columns crack producing an open in the electrical circuit. By using an electrically insulative insert 11 as a local substrate support for the semiconductor, the choice of materials is increased to enable selection of one which has a coefficient of expansion similar to that of chip 12. By proper selection, stresses on the solder columns 18 are significantly reduced, if not eliminated, so that reliability is greatly improved.

Although alumina is preferred as a composition of the insert 11, other ceramic materials such as glass or silica or even metals such as Kovar or titanium can be used. In the case of metallic inserts, of course, an insulative layer of resin or other suitable material is placed between the circuit lines 13 and surface 19 of the insert. The organic material of primary substrate 10 is formed with sufficient compression and at a sufficiently high temperature so that during temperature cycling it does not loosen at the junction between the insert and primary substrate. The inherent porosity and roughness of the insert aid in maintaining a reliable bond between the primary substrate and insert. The insert can be roughened by chemical etching. The shrinkage of the resin from its curing temperature also produces a compressive force against the insert.

Figure 3:
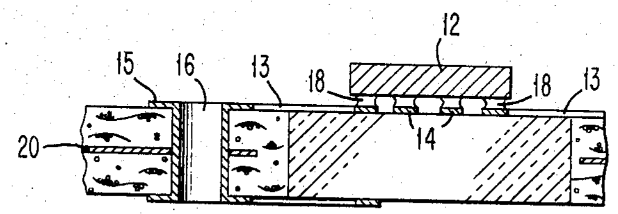
FIGS. 3, 4, and 5 are cross-sectional views of the hybrid substrate of the invention illustrating various modifications thereof.

FIG. 3 illustrates a modification that can readily be made in the structure of the primary substrate 10. This is the addition of an intermediate circuit layer 20 shown connected with plated through-hole 16. It is apparent, of course, that several buried conductive layers can be formed within the body of primary substrate 10 by lamination of the formed circuit planes during construction of the substrate.

Figure 4:
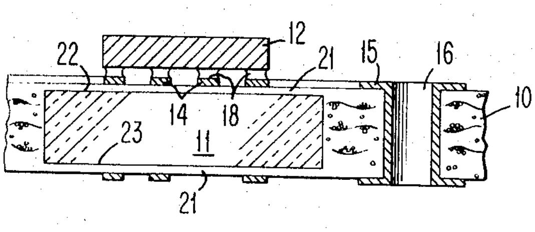

FIG. 4 shows another modification of the structure shown in FIG. 1. In this embodiment, insert 11 is buried entirely within substrate 10. A thin coating of organic insulative material or a layer of resin 21 of the same composition as the primary substrate overlies the two surfaces 22 and 23 of the insert. Construction is accomplished by merely laminating an extra layer of the semi-cured epoxy resin on either or both surfaces of the insert during construction of primary substrate 10. Such structure has the advantage of providing a surface for circuit formation which is of the same material as the major substrate, thus permitting processing steps used during such circuit formation to be the same as with the conventional epoxy-impregnated glass cloth board composition. Although a layer of insulation having a relatively high coefficient of expansion is the supporting material for lands 14, chip 12, and circuit lines 13, the stability of the insert is markedly effective to prevent significant expansion or contraction during temperature fluctuations. The effectiveness, of course is diminished with increasing thickness of the coating. The solder columns 18 are easily able to withstand the relative movement so that the embodiment has a high degree of reliability.

Figure 5:
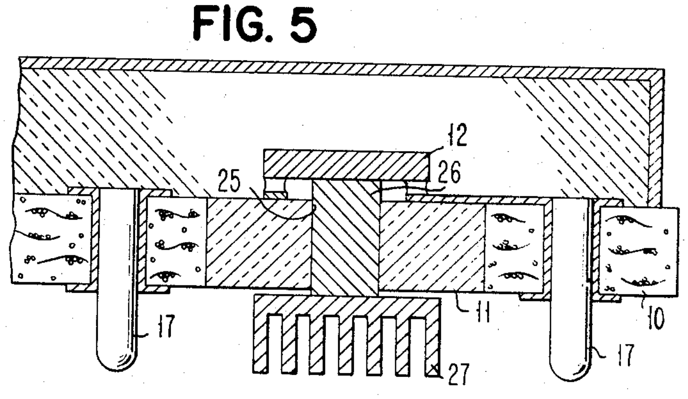

In FIG. 5, insert 11 is formed with a hole 25 therein during manufacture of the insert. After mounting the insert in primary substrate 10, the hole is filled with a good heat conductor 26 such as solder. This material will serve as a heat conduction path from the module 12 to a more suitable heat sink at the bottom surface of the insert and substrate. The heat sink may comprise a finned element 27 which provides a large amount of surface for efficient cooling as shown. Solder 26 permits easy attachment to both chip 12 and heat sink 27. FIG. 5 also illustrates the circuit chip as being encapsulated in a potting material with a protective metal cap. A single cap may be provided to cover the entire composite substrate or individual caps can be used for each chip. An example of a suitable potting material is silicone rubber.

Figure 6:
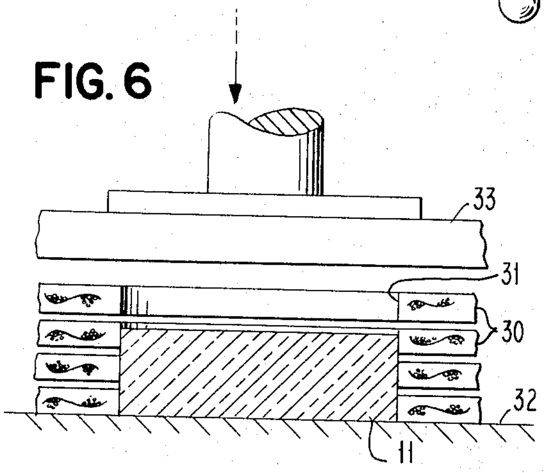
FIGS. 6, 7, and 8 are cross-sectional schematic views illustrating alternative methods of constructing the circuit substrate of the invention.

The hybrid substrate of the invention readily lends itself to conventional fabrication techniques. The preferred method of construction is to use a plurality of "prepreg cores" which are sheets of semi-cured polymeric resin having embedded therein a fibrous material. The organic resin may be either an epoxy or phenolic as is commonly used and the fiber material may be glass-fiber cloth, polyester synthetic textiles or other reinforcing materials. Referring to FIG. 6, a plurality of these semi-cured sheets 30 are each prepunched or drilled to form a hole 31 at each location which is to receive an insert 11. The sheets are laid up on a suitable support plate 32 with the punched holes 31 aligned. Preformed inserts 11 are then dropped into each of the desired locations.

The insert has a thickness equal to the ultimate thickness of the substrate while the lay-up of prepreg sheets extends above the insert an amount which can be subsequently compressed. As shown in the figure, four sheets of prepreg have been stacked so that they extend approximately 50 percent higher than the thickness of the insert. Thereafter, the lay-up of sheets 30 and inserts 11 are placed in a press and compressed by platen 33 under heat and pressure to form the composite substrate. The inserts 11 can take a relatively heavy compression load so that the resin impregnated sheets 30 can be compressed readily to the thickness of the insert. Pressure is held on the assemblage and heat is applied until the resin is completely cured which results in a unitary circuit substrate.

Figure 7:
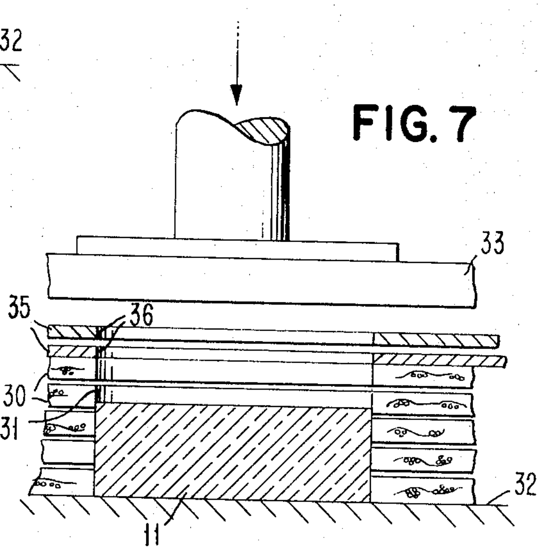

FIG. 7 discloses an alternative technique to construct the substrate which uses a plurality of slip sheets 35 having cutouts 36 conforming to the shape of the insert 11. The slip sheets are used to make the lay-up of prepreg sheets 30 sufficient to prevent the application of pressure to the top of insert 11 in the event the insert cannot withstand the compressive forces experienced during lamination. After compression and curing, the slip sheets can be removed.

Figure 8:
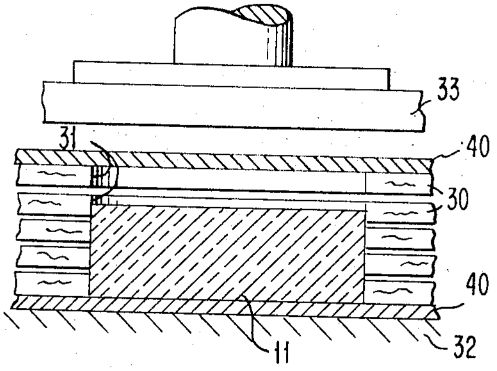

FIG. 8 illustrates the method of forming the substrate shown in FIG. 4. An unpunched sheet 40 of semi-cured resin only is placed between press platens 32 and 33, and the adjacent sheets 30 of punched prepreg. This order of lay-up will result in a thin resin coating over the two circuit-receiving surfaces of the insert.

Inserts 11 are preferably formed by using aluminum oxide powder in a resinous binder and stamping out slugs in suitable shape and size. The slugs are then cured in a furnace sufficient to drive off the organic binder material leaving only the inorganic insert. Although shrinkage of the ceramic is experienced, the flow of resin during compression and curing securely locks the insert in place, so that shrinkage is not a problem. When a ceramic material is used for the inserts, an added advantage is experienced in retention of the insert within the major substrate because of the rough surface of the inorganic material. Inserts can also be formed by machining suitable materials such as Kovar or of sintered metals. The shape and size of the inserts can be changed as a matter of choice. It may be desirable to locate several integrated circuit chips on a larger insert and thereby shorten connecting paths.

Circuits can be formed on the various substrate embodiments by using either the subtractive (etching) or additvie (plating-up) techniques. For the embodiment shown in FIGS. 1 and 2, the subtractive technique would employ an electro-plated layer of metal, usually copper, over the entire surface of the composite substrate. This may be achieved by using conventional steps of first roughening the organic portion of the composite substrate by either including embedded particles of alumina in the top sheet of resin or etching the resin layer lightly with sulfuric acid, for example. The composite substrate would then be immersed in a bath suitable to etch the insert 11, if necessary. In the case of aluminum oxide, a bath such as a molten sodium hydroxide would produce the required roughening. Thereafter, holes are drilled and the composite is immersed in well-known activating and sensitizing baths to cause deposition of a thin layer of copper over the entire surface when immersed in an electroless plating bath. This thin coat of copper can then be built up by electrolytically depositing a thicker coating of copper. With substrate now having copper of a suitable thickness over its surface, a conventional application selective exposure and development of photoresist (preferably a film-type) are employed to provide a protective coat over the desired circuit line and land areas and holes when the substrate is immersed in an etching bath.

With the additive technique, the embodiment of FIGS. 1 and 2 is subjected to the surface roughening, activating and sensitizing steps, but at this point is coated with photoresist which is selectively exposed and developed so as to leave the sensitized substrate exposed in the areas where circuit lines and lands and holes are to be plated. The substrate is then immersed in an autocatalytic plating bath and left until the copper is built up to the desired thickness. The photoresist serving as the plating resist is then removed.

For the buried insert embodiment shown in FIG. 4, the subtractive circuit formation technique is to apply a thin copper foil to the outside surfaces of the composite substrate at the time of laminating the outside layers of resin over the insert. Through-holes are then drilled in the desired locations and the compostie substrate is immersed in activation and sensitizing baths. The substrate is then placed in an electroless copper plating bath to deposit copper on the surfaces of holes and also on the copper foil or other surfaces not protected. After the holes have been plated, a film type of photoresist is applied and selectively exposed and developed to serve as an etching resist. The substrate is then immersed in an etchant to remove the unwanted copper, leaving the lines, lands, and plated hole surfaces intact.

In using the additive technique for the embodiment of FIG. 4, the resinous surface is again microroughened, as mentioned above, and similar steps are followed to drill the through-holes, activate and sensitize the surfaces of the substrate and holes, and apply restrictive photoresist in the desired areas by selective exposure and development. The composite substrate is then immersed in an autocatalytic plating bath to plate up the conductors and the remaining photoresist is subsequently removed. Another additive technique is to incorporate the catalyst which initiates electroless plating directly in the substrate materials so that the activation and sensitizing steps are not required.

The solder mounds on lands 14 and 15 can be formed by either electroplating and suitably placed plating resists or passed over a solder wave. Chip attachment with the invention is accomplished by using either a hot gas or electrical resistance element locally to attach the individual chips. The organic materials such as phenolic or epoxy cannot be passed through the furnace-type solder reflow device, because of their inability to withstand the required temperatures. Devices for temporarily supporting chips during reflow are well known and are not considered part of this invention.

Although the composite substrate has been described with circuit lines formed on both major surfaces of the substrate, this is optional as are through-holes and intermediate conductive planes. The inserts 11, of course, can be constructed in larger sizes and with various through-holes formed within the insert if found desirable. The consideration entering into the determination of the insert size may be the method of producing reflow of the solder mounds between insert and chip. Since the insert can withstand greater temperatures, it may be appropriate to increase insert size to provide a protective margin between the chip edges and organic material of the substrate 10.

While the invention has been particularly shown and described with reference to preferred embodiments thereof, it will be understood by those skilled in the art that the foregoing and other changes in form and details may be therein without departing from the spirit of the invention.

What is claimed is:

1. A support for electrical conductors and components comprising:

a first electrically insulative substrate member having a first coefficient of expansion;

a second electrically insulative substrate member embedded in said first substrate member and having a smaller coefficient of expansion; and at least one electrical conductor secured along its length to at least one of said members and overlying both said members.

2. A support for electrical conductors and components comprising:

a first substrate containing an organic insulative material; and a second substrate of solely inorganic, insulative material embedded in said first substrate and being of a size to support at least one of said components.

3. A planar support for electrical conductors and components comprising:

a first support containing organic and inorganic materials to provide an electrically insulative substrate having a first composite coefficient of expansion; and at least one second support embedded in said first support, and second support being comprised of an inorganic, insulative material and having a second coefficient of expansion less than said first composite coefficient of expansion.

4. A support member as described in claim 3 further including an electrical component mounted on said second support.

5. A support structure for electrical conductors and components comprising:

the first substrate of an electrically insulative organic material having at least one planar support surface and having a predetermined coefficient of expansion;

a second substrate solely of electrical insulative inorganic material embedded in said first substrate with a major support surface exposed and having a coefficient of expansion less than said first substrate;

at least one electrical conductor overlying both said first and second substrates and attached thereto; and a semiconductive circuit component attached to said conductor over said second substrate and having a coefficient of expansion approximating that of said second substrate.

6. A support structure as described in claim 2 wherein said second substrate has two opposed major support surfaces and a peripheral interconnecting surface and said first substrate material contacts said second substrate material along said peripheral surface leaving said two opposed major surfaces exposed.

7. A support structure as descriged in claim 6 wherein one of said major support surfaces of said second substrate is connected to a heat sink.

8. A support structure for electrical circuits and semiconductor components comprising:

a first substrate of electrically insulative organic material having a planar support surface;

a second substrate of electrically insulative inorganic material embedded in said first substrate and having at least one exposed planar support surface;

a plurality of electrical conductors each overlying both said substrates and the junction therebetween and secured along its entire length to one or the other of said surfaces; and at least one electrical semiconductor component attached to said conductors overlying said second substrate, said attachment being made with a fusable metal having a melting point lower than said component and said second substrate material.

9. A support structure as described in claim 8 wherein said support surfaces of said first and second substrates are co-planar.

10. A support structure as described in claim 8 wherein each said substrate includes a pair of parallel support surfaces and each support surface on one substrate is substantially co-planar with a support surface on the other substrate.

11. A support structure as described in claim 8 further including:

a plurality of second substrates embedded in said first substrate, with each of said second substrates having a planar support surface;

a plurality of electrical conductors, each commonly attached to support surface of said first substrate and a planar support surface of said second substrates; and at least one said semiconductor component mounted overlying each of said plurality of second substrates on the said conductors thereon.

12. Structure as described in claim 8 wherein said first substrate is comprised of a thermosetting resin and glass fibers and said second substrate is a ceramic composition.

13. A structure as described in claim 8 wherein said first substrate material is a thermoplastic resin.

14. A support structure for electrical circuits and components comprising:

a first substrate of electrically insulative organic material having a planar support surface;

a second substrate of electrically insulative, inorganic material buried within said first substrate;

at least one electrical conductor secured to said first substrate material and passing across at least a portion of said second substrate; and an electrical component attached to said conductor overlying said second substrate.

* * * * *